US006455939B1

(12) United States Patent
Raina et al.

(10) Patent No.: US 6,455,939 B1
(45) Date of Patent: Sep. 24, 2002

(54) SUBSTANTIALLY HILLOCK-FREE ALUMINUM-CONTAINING COMPONENTS

(75) Inventors: Kanwal K. Raina; David H. Wells, both of Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/570,879

(22) Filed: May 15, 2000

Related U.S. Application Data

(62) Division of application No. 09/290,532, filed on Apr. 12, 1999, now Pat. No. 6,107,688, which is a continuation of application No. 08/892,718, filed on Jul. 15, 1997, now Pat. No. 5,969,423.

(51) Int. Cl.[7] .......................... H01L 23/12; H01L 23/48; H01L 29/40
(52) U.S. Cl. ....................... 257/765; 257/770; 257/771; 438/937
(58) Field of Search ........................ 257/763, 59, 770, 257/765, 764; 438/937

(56) References Cited

U.S. PATENT DOCUMENTS

| 3,631,304 A | 12/1971 | Bhatt |
| 3,654,526 A | 4/1972 | Cunningham et al. |
| 3,717,564 A | 2/1973 | Bhatt |

(List continued on next page.)

FOREIGN PATENT DOCUMENTS

| EP | 0 352 333 A1 | 1/1990 |
| EP | 0 855 451 A1 | 7/1998 |
| JP | 1-169759 | 7/1989 |
| JP | 10-178193 | 6/1998 |

OTHER PUBLICATIONS

Hall et al., "A Clad Aluminum Gate Process for Advanced TFT Manufacturing," Applied Komatsu Technology, pp. 93–94 (1992).

Hu et al., "Electromigration and stress–induced voiding in fine Al and Al–alloy thin–film lines," IBM J. Res. Develop., vol. 39, No. 4, pp. 465–497 (Jul. 1995).

Iwamura et al., "Characterization of Al–Nd Alloy Thin Films for Interconnections of TFT–LCDs," Elect. Resl. Lab., (1995).

Kim et al., "Pure Al an Al–Alloy Gate–Line Processes in TFT–LCDs," SID 96 Digest, § 22.2, pp. 337–340 (1996).

Koubuchi et al., "Stress migration resistance and contact characterization of Al–Pd–Si interconnects for very large scale integrations," J. Vac. Technol. B, vol. 8, No. 6, pp. 1232–1238 (Nov./Dec. 1990).

Lee et al., "Effect of hydrogen addition on the preferred orientation of AlN films prepared by reactive sputtering," Thin Solid Films, vol. 271, pp. 50–55 (Jul. 1995).

(List continued on next page.)

Primary Examiner—Jerome Jackson, Jr.
Assistant Examiner—Shrinivas H. Rao
(74) Attorney, Agent, or Firm—TraskBritt (57) ABSTRACT

An aluminum-containing film having an oxygen content within the film. The aluminum-containing film is formed by introducing hydrogen gas and oxygen gas along with argon gas into a sputter deposition vacuum chamber during the sputter deposition of aluminum or aluminum alloys onto a semiconductor substrate. The aluminum-containing film so formed is hillock-free and has low resistivity, relatively low roughness compared to pure aluminum, good mechanical strength, and low residual stress.

15 Claims, 7 Drawing Sheets

U.S. PATENT DOCUMENTS

| | | |
|---|---|---|
| 4,302,498 A | 11/1981 | Faith, Jr. |
| 4,666,808 A | 5/1987 | Kawamura et al. |
| 4,845,050 A | 7/1989 | Kim |
| 4,871,647 A | 10/1989 | Kim et al. |
| 5,036,382 A * | 7/1991 | Yamaha .................... 357/71 |
| 5,096,279 A | 3/1992 | Hornbeck et al. |
| 5,148,259 A | 9/1992 | Kato et al. |
| 5,243,202 A * | 9/1993 | Mori et al. .................. 257/59 |
| 5,328,873 A | 7/1994 | Mikoshiba et al. |
| 5,358,901 A | 10/1994 | Fiordalice et al. |
| 5,367,179 A * | 11/1994 | Mori et al. .................. 257/59 |
| 5,387,546 A | 2/1995 | Maeda |
| 5,393,699 A | 2/1995 | Mikoshiba et al. |
| 5,403,762 A | 4/1995 | Takemura |
| 5,416,351 A | 5/1995 | Ito et al. |
| 5,434,104 A | 7/1995 | Cain et al. |
| 5,449,640 A | 9/1995 | Hunt et al. |
| 5,453,405 A | 9/1995 | Fan et al. |
| 5,475,267 A | 12/1995 | Ishii et al. |
| 5,486,939 A | 1/1996 | Fulks |
| 5,491,347 A | 2/1996 | Allen et al. |
| 5,518,805 A | 5/1996 | Ho et al. |
| 5,572,046 A | 11/1996 | Takemura |
| 5,580,468 A | 12/1996 | Fujikawa et al. |
| 5,583,075 A | 12/1996 | Ohzu et al. |
| 5,594,280 A | 1/1997 | Sekiguchi et al. |
| 5,739,549 A | 4/1998 | Takemura et al. |
| 5,942,767 A * | 8/1999 | Na et al. .................. 257/59 |
| 6,057,238 A | 5/2000 | Raina et al. |
| 6,130,119 A * | 10/2000 | Jinnai .................. 438/155 |

OTHER PUBLICATIONS

Onishi, "Influence of adding transition metal elements to an aluminum target on electrical resistivity and hillock resistance in sputter–deposited aluminum alloy thin films," J. Vac. Sci. Technol. A, vol. 14, No. 5, pp. 2728–2735 (Sep./Oct. 1996).

Rohde et al., Sputter Deposition of Thin Films, pp. 94–126 (date unknown).

Ryan et al., "The evolution of interconnection technology at IBM," IBM J. Res. Develop., vol. 39, No. 4, pp. 465–497 (Jul. 1995).

* cited by examiner

SUBSTANTIALLY HILLOCK-FREE ALUMINUM-CONTAINING COMPONENTS

CROSS-REFERENCE TO RELATED APPLICATIONS

This application is a divisional of application Ser. No. 09/290,532, filed Apr. 12, 1999, now U.S. Pat. No. 6,107,688 issued Aug. 22, 2000, which is a continuation of application Ser. No. 08/892,718, filed Jul. 15, 1997, now U.S. Pat. No. 5,969,423, issued Oct. 19, 1999.

BACKGROUND OF THE INVENTION

1. Field of the Invention

This invention relates generally to a method of sputter deposition of an aluminum-containing film onto a semiconductor substrate, such as a silicon wafer. More particularly, the invention relates to using hydrogen and oxygen ,as with argon during the deposition of aluminum or aluminum alloys to form an aluminum-containing film which is resistant to hillock formation.

2. State of the Art

Thin film structures are becoming prominent in the circuitry components used in integrated circuits ("ICs") and in active matrix liquid crystal displays ("AMLCDs"). In many applications utilizing thin film structures, low resistivity of metal lines (gate lines and data lines) within those structures is important for high performance. For example with AMLCDs, low resistivity metal lines minimize RC delay which results in faster screen refresh rates. Refractory metals, such as chromium (Cr), molybdenum (Mo), tantalum (Ta), and tungsten (W), have resistances which are too high for use in high performance AMLCDs or ICs. Additionally, the cost of refractory metals is greater than non-refractory metals. From the standpoint of low resistance and cost, aluminum (Al) is a desirable metal. Furthermore, aluminum is advantageous because it forms an oxidized film on its outer surfaces which protects the aluminum from environmental attack, and aluminum has good adhesion to silicon and silicon compounds.

An aluminum film is usually applied to a semiconductor substrate using sputter deposition. Sputter deposition is generally performed inside the vacuum chamber where a solid slab (called the "target") of the desired film material, such as aluminum, is mounted and a substrate is located. Argon gas is introduced into the vacuum chamber and an electrical field is applied between the target and the substrate which strikes a plasma. In the plasma, gases are ionized and accelerated, according to their charge and the applied electrical field, toward the target. As the argon atoms accelerate toward the target, they gain sufficient momentum to knock off or "sputter" atoms and/or molecules from the target's surface upon impact with the target. After sputtering the atoms and/or molecules from the target, the argon ions, the sputtered atoms/molecules, argon atoms and electrons generated by the sputtering process, form a plasma region in front of the target before coming to rest on the semiconductor substrate, which is usually positioned below or parallel to the target within the vacuum chamber. However, the sputtered atoms and/or molecules may scatter within the vacuum chamber without contributing to the establishment of the plasma region and thus not deposit on the semiconductor substrate. This problem is at least partly resolved with a "magnetron sputtering system" which utilizes magnets behind and around the target. These magnets help confine the sputtered material in the plasma region. The magnetron sputtering system also has the advantage of needing lower pressures in the vacuum chamber than other sputtering systems. Lower pressure within the vacuum chamber contributes to a cleaner deposited film. The magnetron sputtering system also results in a lower target temperature, which is conducive to sputtering of low melt temperature materials, such as aluminum and aluminum alloys.

Although aluminum films have great advantages for use in thin film structures, aluminum has an unfortunate tendency to form defects, called "hillocks". Hillocks are projections that erupt in response to a state of compressive stress in a metal film and consequently protrude from the metal film surface.

There are two reasons why hillocks are an especially severe problem in aluminum thin films. First, the coefficient of thermal expansion of aluminum (approximately $23.5 \times 10^{-6}/°C$.) is almost ten times as large as that of a typical silicon semiconductor substrate (approximately $2.5 \times 10^{-6}/°$ C). When the semiconductor substrate is heated during different stages of processing of a semiconductor device, the thin aluminum film, which is strongly adhered to the semiconductor substrate, attempts to expand more than is allowed by the expansion of the semiconductor substrate. The inability of the aluminum film to expand results in the formation of the hillocks to relieve the expansion stresses. The second factor involves the low melting point of aluminum (approximately 660° C.), and the consequent high rate of vacancy diffusion in aluminum films. Hillock growth takes place as a result of a vacancy-diffusion mechanism. Vacancy diffusion occurs as a result of the vacancy-concentration gradient arising from the expansion stresses. Additionally, the rate of diffusion of the aluminum increases very rapidly with increasing temperature. Thus, hillock growth can thus be described as a mechanism that relieves the compressive stress in the aluminum film through the process of vacancy diffusion away from the hillock site, both through the aluminum grains and along grain boundaries. This mechanism often drives up resistance and may cause open circuits.

The most significant hillock-related problem in thin film structure manufacturing occurs in multilevel thin film structures. In such structures, hillocks cause interlevel shorting when they penetrate or punch through a dielectric layer separating overlying metal lines. This interlevel shorting can result in a failure of the IC or the AMLCD. Such a shorted structure is illustrated in FIG. 11.

Figure 11:
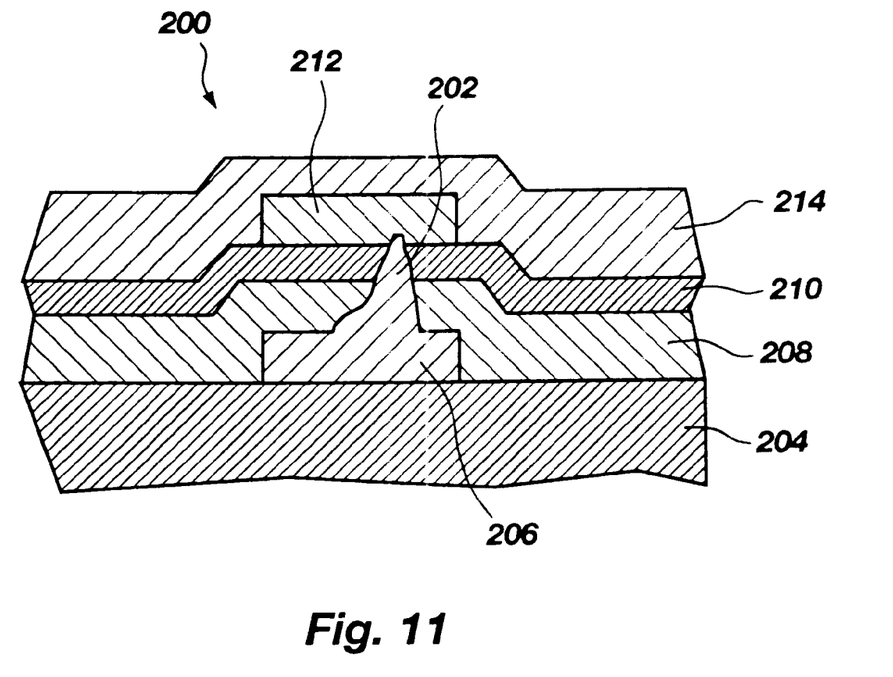
FIG. 11 is a cross-sectional side view illustration of interlevel shorting resulting from hillock formation.

FIG. 11 illustrates a hillock 202 in a thin film structure 200. The thin film structure 200 comprises a semiconductor substrate 204, such as a silicon wafer, with a patterned aluminum layer 206 thereon. A lower dielectric layer 208, such as a layer of silicon dioxide or silicon nitride, is deposited over the semiconductor substrate 204 and the patterned aluminum layer 206. The lower dielectric layer 208 acts as an insulative layer between the patterned aluminum layer 206 and an active layer 210 deposited over the lower dielectric layer 208. A metal line 212 is patterned on the active layer 210 and an upper dielectric layer 214 is deposited over the metal line 212 and the active layer 210. The hillock 202 is shown penetrating through the lower dielectric layer 208 and the active layer 210 to short with the metal line 212.

Numerous techniques have been tried to alleviate the problem of hillock formation, including: adding elements, such as tantalum, cobalt, nickel, or the like, that have a limited solubility in aluminum (however, this generally only reduces but not eliminates hillock formation); depositing a layer of tungsten or titanium on top or below the aluminum film (however, this requires additional processing steps);

layering the aluminum films with one or more titanium layers (however, this increases the resistivity of the film); and using hillock resistant refractory metal films such as tungsten or molybdenum, rather than aluminum (however, as previously mentioned, these refractory metals are not cost effective and have excessive resistivities for use in high performance ICs and AMLCDs).

In particular with AMLCDs and, more particularly, with thin film transistor-liquid crystal displays ("TFT-LCDs"), consumer demand is requiring larger screens, higher resolution, and higher contrast. As TFT-LCDs are developed in response to these consumer demands, the need for metal lines which have low resistivity and high resistance to hillock formation becomes critical.

Therefore, it would be advantageous to develop an aluminum-containing material which is resistant to the formation of hillocks and a technique for forming an aluminum-containing film on a semiconductor substrate which is substantially free from hillocks, while using inexpensive, commercially-available, widely-practiced semiconductor device fabrication techniques and apparatus without requiring complex processing steps.

BRIEF SUMMARY OF THE INVENTION

The present invention relates to a method of introducing hydrogen and oxygen gas, along with argon gas, into a sputter deposition vacuum chamber during the sputter deposition of aluminum or aluminum alloys onto a semiconductor substrate, including but not limited to glass, quartz, aluminum oxide, silicon, oxides, plastics, or the like, and to the aluminum-containing films resulting therefrom.

The method of the present invention involves using a standard sputter deposition chamber, preferably a magnetron sputter deposition chamber, at a power level of between about 1 and 4 kilowatts (KW) of direct current power applied between a cathode (in this case the aluminum target) and an anode (flat panel display substrate—i.e., soda lime glass) to create the plasma (after vacuum evacuation of the chamber). The chamber is maintained at a pressure of between about 0.5 and 2.5 millitorr with an appropriate amount of argon gas, hydrogen gas, and oxygen gas flowing into the chamber. The argon gas is preferably fed at a rate between about 25 and 90 standard cubic centimeters per minute ("sccm"). The hydrogen gas is preferably fed at a rate between about 50 and 400 sccm. The oxygen gas is preferably fed at a rate between about 0.25 and 2 sccm (preferably in an atmospheric air stream). The ratio of argon gas to hydrogen gas is preferably between about 1:1 and about 1:6. The films with higher hydrogen/argon ratios exhibited smoother texture than lower hydrogen/argon ratios. The deposition process is conducted at room temperature (i.e., about 22° C.).

The aluminum-containing films resulting from this method have an average oxygen content between about 12 and 30% (atomic) oxygen in the form of aluminum oxide ($Al_2O_3$) with the remainder being aluminum. The aluminum-containing films exhibit golden-yellow color when formed under the process parameters described. The most compelling attribute of the aluminum-containing films resulting from this method is that they are hillock-free, even after being subjected to thermal stresses.

Although the precise mechanical and/or chemical mechanism for forming these aluminum-containing films is not completely understood, it appears that the hydrogen gas functions in the manner of a catalyst for delivering oxygen into the aluminum-containing films. Although the flow of the oxygen gas into the vacuum chamber is small compared to the flow of argon gas and hydrogen gas, there is a relatively large percentage of oxygen present in the deposited aluminum-containing films. In experiments by the inventors, oxygen gas was introduced into the vacuum chamber without any hydrogen gas being introduced (i.e., only oxygen gas and argon gas introduced). The resulting films deposited on the substrate did not have a measurable amount (by x-ray photoelectron spectroscopy) of oxygen present.

As stated previously, oxygen is present in the deposited aluminum-containing film in the form of aluminum oxide. However, aluminum oxide is an insulator. It is counter-intuitive to form an insulative compound (which should increase the resistivity of the film) in a film which requires very low resistivity. However, it has been found that the formation of the aluminum oxide does not interrupt the conducting matrix of aluminum grains within the aluminum-containing film. Thus, the resistivity of the aluminum-containing film is surprisingly low, in the order of between about 6 and 10 micro ohm-cm. This is particularly striking in light of the fact that aluminum oxide is present in the range of between about 12 and 30% (atomic). The grain size of these aluminum-containing films is between about 400 and 600 angstroms (Å).

Aside from being substantially hillock-free and having a low resistivity (i.e., high conductivity), the resultant aluminum-containing films have additional desirable properties including low roughness, low residual stress, and good mechanical strength (as determined by a simple scratch test compared to pure aluminum or by the low compressive stress (between about $-5 \times 10^8$ and $-1 \times 10^9$ dyne/cm$^2$), which is considered to be an indication of high scratch resistance). Measurements of the aluminum-containing films have shown that the roughness before and after annealing is low compared to pure aluminum (about 600–1000 Å before annealing and 400–550 Å after annealing). Low roughness prevents stress migration, prevents stress-induced voids, and, consequently, prevents hillock formation. Additionally, low roughness allows for better contact to other thin films and widens the latitude of subsequent processing steps, since less rough films result in less translation of crests and valleys in the film layers deposited thereover, less diffuse reflectivity which makes photolithography easier, no need to clad the aluminum in the production of AMLCDs (rough aluminum traps charge which effects electronic performance [i.e., high or variable capacitance]), and more uniform etching.

The mechanical strength of the aluminum-containing films resulting from the process of the invention is higher than conventionally sputtered thin films of aluminum and some of its alloys. A high mechanical strength results in the resulting aluminum-containing films being resistant to both electromigration and stress induced voiding.

This combination of such properties is superior to that of thin films of aluminum and its alloys which are presently known. These properties make the aluminum-containing films of the present invention desirable for electronic device interconnects. These properties are also desirable in thin films for optics, electro-optics, protective coatings, and ornamental applications.

BRIEF DESCRIPTION OF THE SEVERAL VIEWS OF THE DRAWINGS

While the specification concludes with claims particularly pointing out and distinctly claiming that which is regarded as the present invention, the advantages of this invention can be more readily ascertained from the following description of the invention when read in conjunction with the accompanying drawings in which:

DETAILED DESCRIPTION OF THE INVENTION

The method of the present invention preferably involves using a conventional magnetron sputter deposition chamber within the following process parameters:

Power (DC): between about 1 and 4 KW
Pressure: between about 0.5 and 2.5 millitorr
Argon Gas Flow Rate: between about 25 and 90 sccm
Hydrogen Gas Flow Rate: between about 50 and 400 sccm
Oxygen Gas Flow Rate: between about 0.25 and 2 sccm
Argon:Hydrogen Gas Ratio: between about 1:1 and 1:6

The operation of the magnetron sputter deposition chamber generally involves applying the direct current power between the cathode (in this case the aluminum target) and the anode (substrate) to create the plasma. The chamber is maintained within the above pressure range and an appropriate mixture of argon gas, hydrogen gas, and oxygen gas is delivered to the chamber. The aluminum-containing films resulting from this method have between about 12 and 30% (atomic) oxygen in the form of aluminum oxide ($Al_2O_3$) with the remainder being aluminum.

It is believed that the primary hillock prevention mechanism is the presence of the hydrogen in the system, since it has been found that even using the system with no oxygen or virtually no oxygen present (trace amounts that are unmeasurable by present equipment and techniques) results in a hillock-free aluminum-containing film. It is also believed that the presence of oxygen in the film is primarily responsible for a smooth (less rough) aluminum-containing film, since roughness generally decreases with an increase in oxygen content in the film.

EXAMPLE 1

A control sample of an aluminum film coating on a semiconductor substrate was formed in a manner exemplary of prior art processes (i.e., no hydrogen gas present) using a Kurdex—DC sputtering system to deposit aluminum from an aluminum target onto a soda-lime glass substrate.

The substrate was loaded in a load lock chamber of the sputtering system and evacuated to about $5\times10^{-3}$ torr. The load lock was opened and a main deposition chamber was evacuated to about $10^{-7}$ torr before the substrate was moved into the main deposition chamber for the sputtering process. The evacuation was throttled and specific gases were delivered into the main deposition chamber. In the control deposition, argon gas alone was used for the sputtering process. Once a predetermined amount of argon gas was stabilized (about 5 minutes) in the main deposition chamber, about 2 kilowatts of direct current power was applied between a cathode (in this case the aluminum target) and the anode (substrate) to create the plasma, as discussed above. The substrate was moved in front of the plasma from between about 8 and 10 minutes to form an aluminum-containing film having a thickness of about 1800 angstroms.

Table 1 discloses the operating parameters of the sputtering equipment and the characteristics of the aluminum film formed by this process.

TABLE 1

|  | Control Sample |
| --- | --- |
| Sputtering Process Parameters | |
| Power (KW) | 2 |
| Pressure (mtorr) | 2.05 |
| Gas Flow (sccm) | Argon = 90 |
| Characterization Parameters and Properties | |
| Thickness (Å) | 1800 |
| Stress (dyne/cm$^2$) (compressive) | $-4.94 \times 10^8$(C) |
| Roughness (Å) | 1480 (unannealed) |
|  | 2040 (annealed) |
| Resistivity ($\mu\Omega$-cm) | 2.70 |
| Grain Size (Å) | 1000–1200 |
| Hillock Density | approx. 2 to 5 $\times 10^9/m^2$ |

The measurements for the characterization parameters and properties were taken as follows: thickness—Stylus Profilometer and scanning electron microscopy; stress—Tencor FLX using laser scanning; roughness—atomic force microscopy; resistivity—two point probe; grain size—scanning electron microscopy; and hillock density—scanning electron microscopy.

Figure 1:
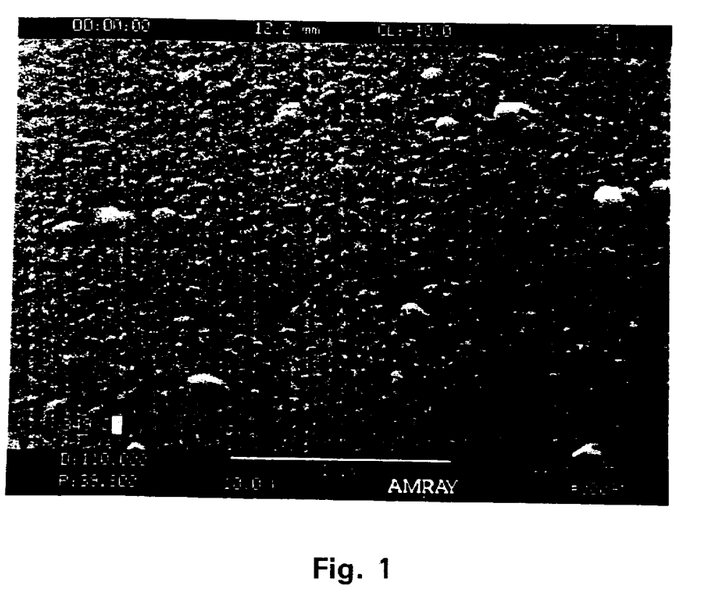
FIGS. 1 and 2 are illustrations of scanning electron micrographs of an aluminum thin film produced by a prior art method before annealing and after annealing, respectively.
Figure 2:
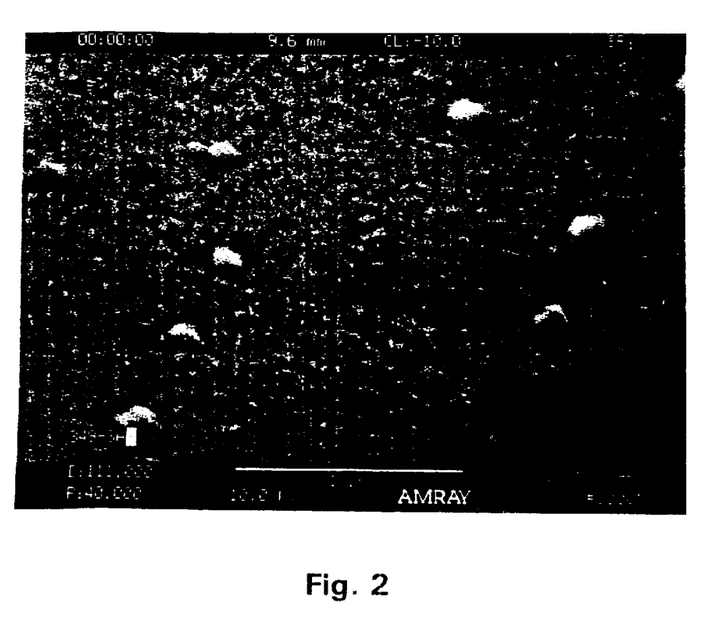

FIG. 1 is an illustration of a scanning electron micrograph of the surface of the aluminum film produced under the process parameters before annealing. FIG. 2 is an illustration of a scanning electron micrograph of the surface of the aluminum-containing film produced under the process parameters after annealing. Both FIGS. 1 and 2 show substantial hillock formation both before and after annealing.

EXAMPLE 2

Two test samples (test sample 1 and test sample 2) of an aluminum film coating on a semiconductor substrate were fabricated using the method of the present invention. These two test samples were also formed using the Kurdex—DC sputtering system with an aluminum target depositing on a soda-lime glass substrate.

The operating procedures of the sputtering system were essentially the same as the control sample, as discussed above, with the exception that the gas content vented into the main deposition chamber included argon, hydrogen, and oxygen (wherein oxygen is preferably introduced in an atmospheric air stream). Additionally, the pressure in the main deposition chamber during the deposition and the thickness of the aluminum-containing film were varied from that control sample for each of the test samples.

Table 2 discloses the operating parameters of the sputtering equipment and the characteristics of the two aluminum films formed by the process of the present invention.

TABLE 2

|  | Test Sample 1 | Test Sample 2 |
| --- | --- | --- |
| Sputtering Process Parameters | | |
| Power (KW) | 2 | 2 |
| Pressure (mtorr) | 0.66 | 2.5 |
| Gas Flow (sccm) | Argon = 25 | Argon = 90 |
|  | Hydrogen = 50 | Hydrogen = 200 |
| Oxygen Flow (sccm) | about 0.25 to 0.5 | about 0.25 to 0.5 |
| Characterization Parameters and Properties | | |
| Thickness (Å) | 2000 | 1800 |
| Stress (dyne/cm$^2$) | 4.93 × 10$^8$(T)* | −1.6 × 10$^8$(C)** |
| Roughness (Å) | 980 (unannealed) | 640 (unannealed) |
|  | 520 (annealed) | 410 (annealed) |
| Resistivity ($\mu\Omega$-cm) | 6.4 | 7.2 |
| Grain Size (Å) | 400–600 | 400–600 |
| Film Oxygen Content | approx. max. 25% | approx. max. 20% |
| Hillock Density | no hillocks present | no hillocks present |

*Tensile
**Compressive

Figure 3:
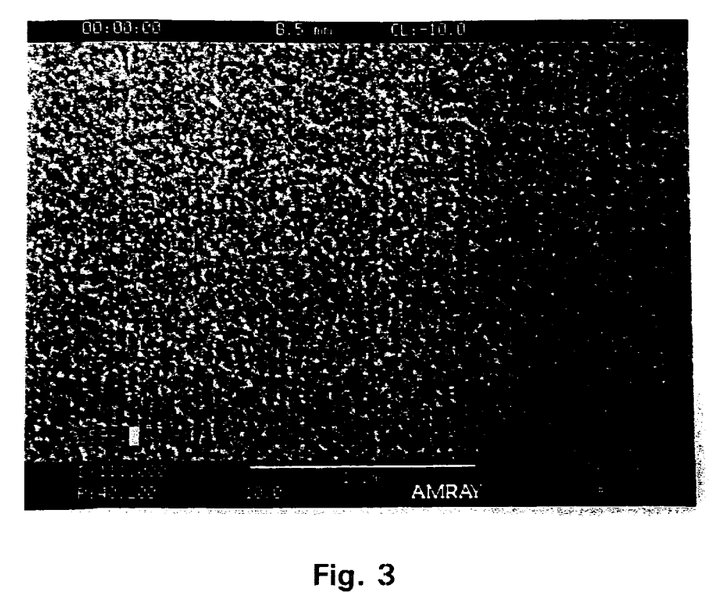
FIGS. 3 and 4 are illustrations of scanning electron micrographs of an aluminum thin film (Test Sample 1) produced by a method of the present invention before annealing and after annealing, respectively.
Figure 4:
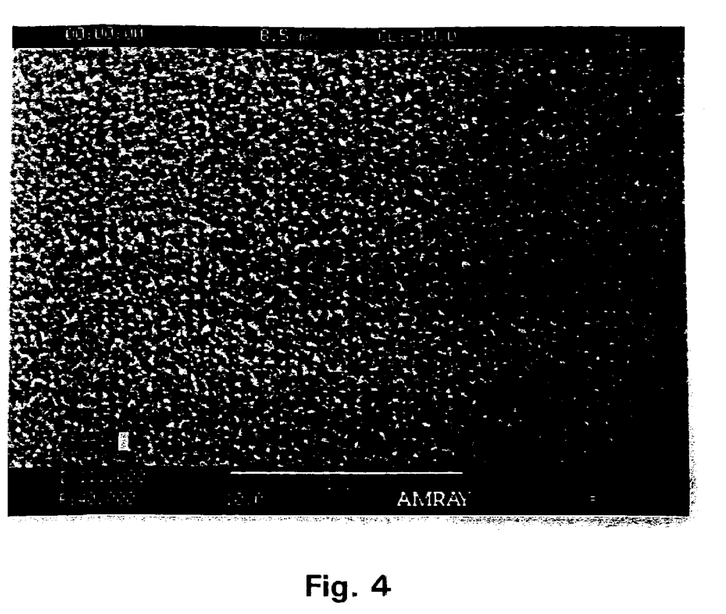
Figure 5:
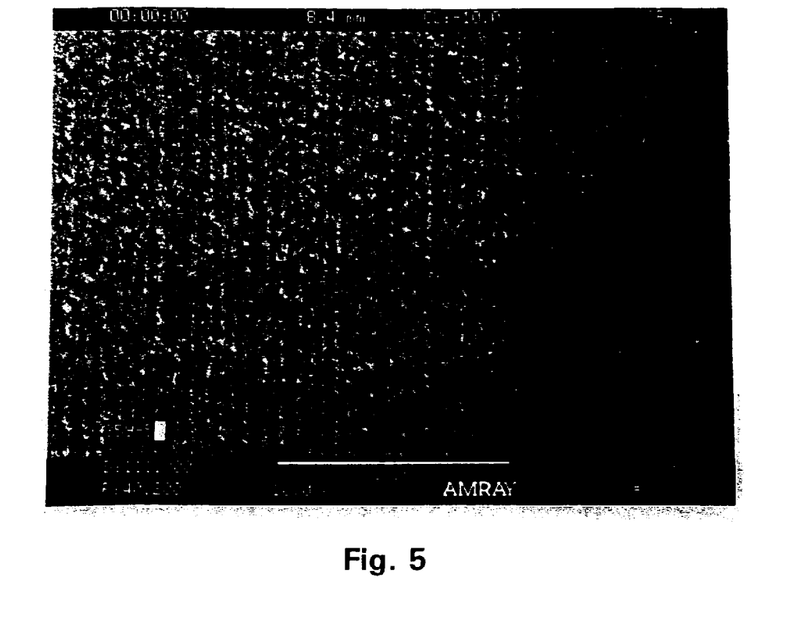
FIGS. 5 and 6 are illustrations of scanning electron micrographs of an aluminum thin film (Test Sample 2) produced by a method of the present invention before annealing and after annealing, respectively.
Figure 6:
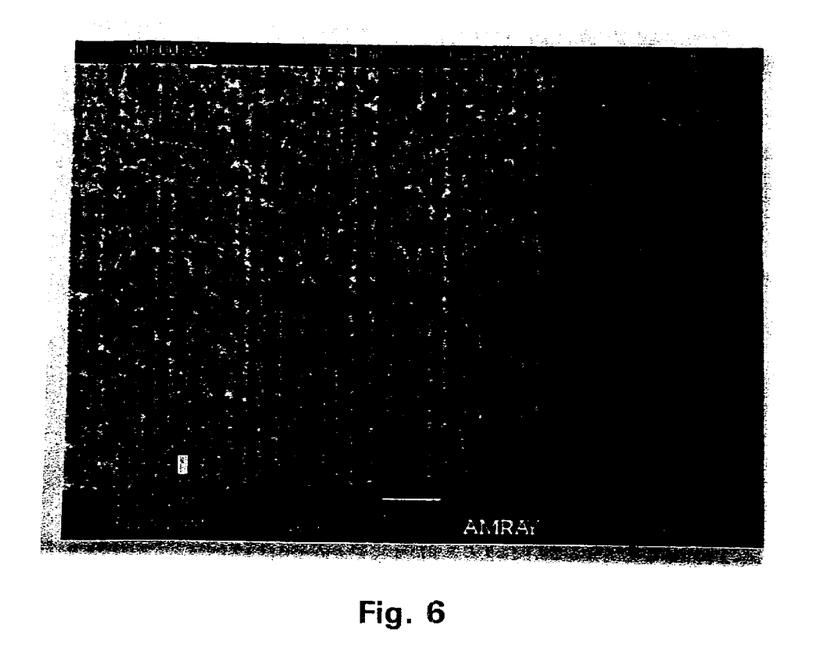

FIG. 3 is an illustration of a scanning electron micrograph of the surface of the Test Sample 1 before annealing. FIG. 4 is an illustration of a scanning electron micrograph of the surface of the Test Sample 1 after annealing. FIG. 5 is an illustration of a scanning electron micrograph of the surface of the Test Sample 2 before annealing. FIG. 6 is an illustration of a scanning electron micrograph of the surface of the Test Sample 2 after annealing. As it can be seen from FIGS. 3–6, no hillocks form on either sample whether annealed or not.

EXAMPLE 3

A number of aluminum-containing films were made at different ratios of Ar/H$_2$ and various system pressures were measured for oxygen content within the films. The oxygen gas flow rate was held constant at about 2 sccm and the power was held constant at 2 KW. The oxygen content was measure by XPS (x-ray photoelectron spectroscopy). The results of the measurements are shown in Table 3.

TABLE 3

| Sample Number | Ar/H$_2$ (sccm) | Ar/H$_2$ Ratio | Pressure (millitorr) | Oxygen Content Range (atomic %) |
| --- | --- | --- | --- | --- |
| 1 | 90/400 | 0.225 | 2.50 | 12–25 |
| 2 | 90/300 | 0.300 | 2.40 | 15–30 |
| 3 | 50/200 | 0.250 | 1.50 | 15–25 |
| 4 | 25/50 | 0.500 | 0.60 | 25–30 |
| 5 | 90/50 | 1.800 | 2.10 | 15–25 |

Figure 7:
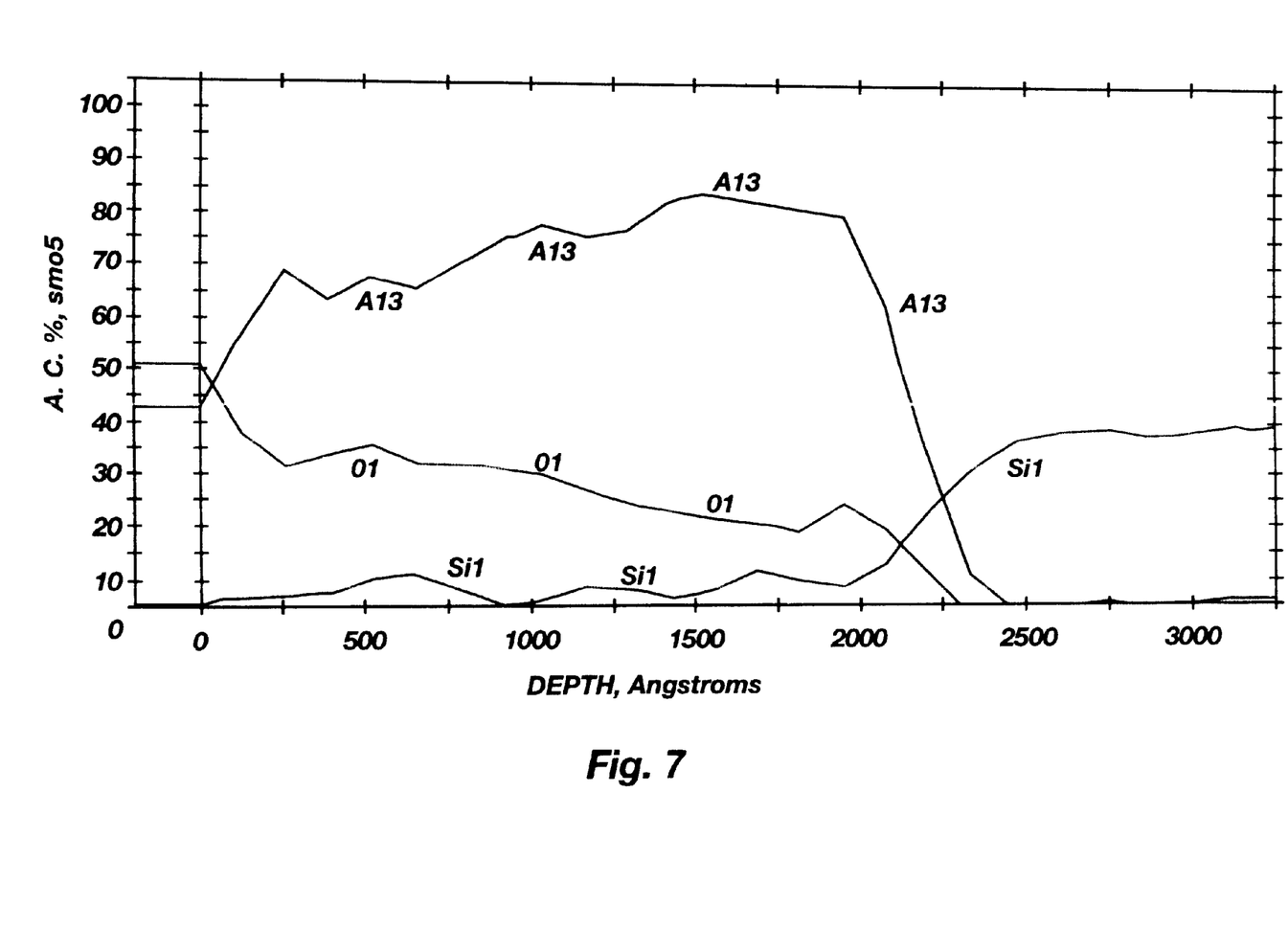
FIG. 7 is an x-ray photoelectron spectroscopy graph showing the oxygen content through the depth of an aluminum-containing film produced by a method of the present invention.

An XPS depth profile for sample 4 (Ar/H$_2$ (sccm)=25/50, pressure=0.60) is illustrated in FIG. 7 which shows the oxygen content varying on average between about 25 and 30% (atomic) through the depth of the film.

Figure 8:
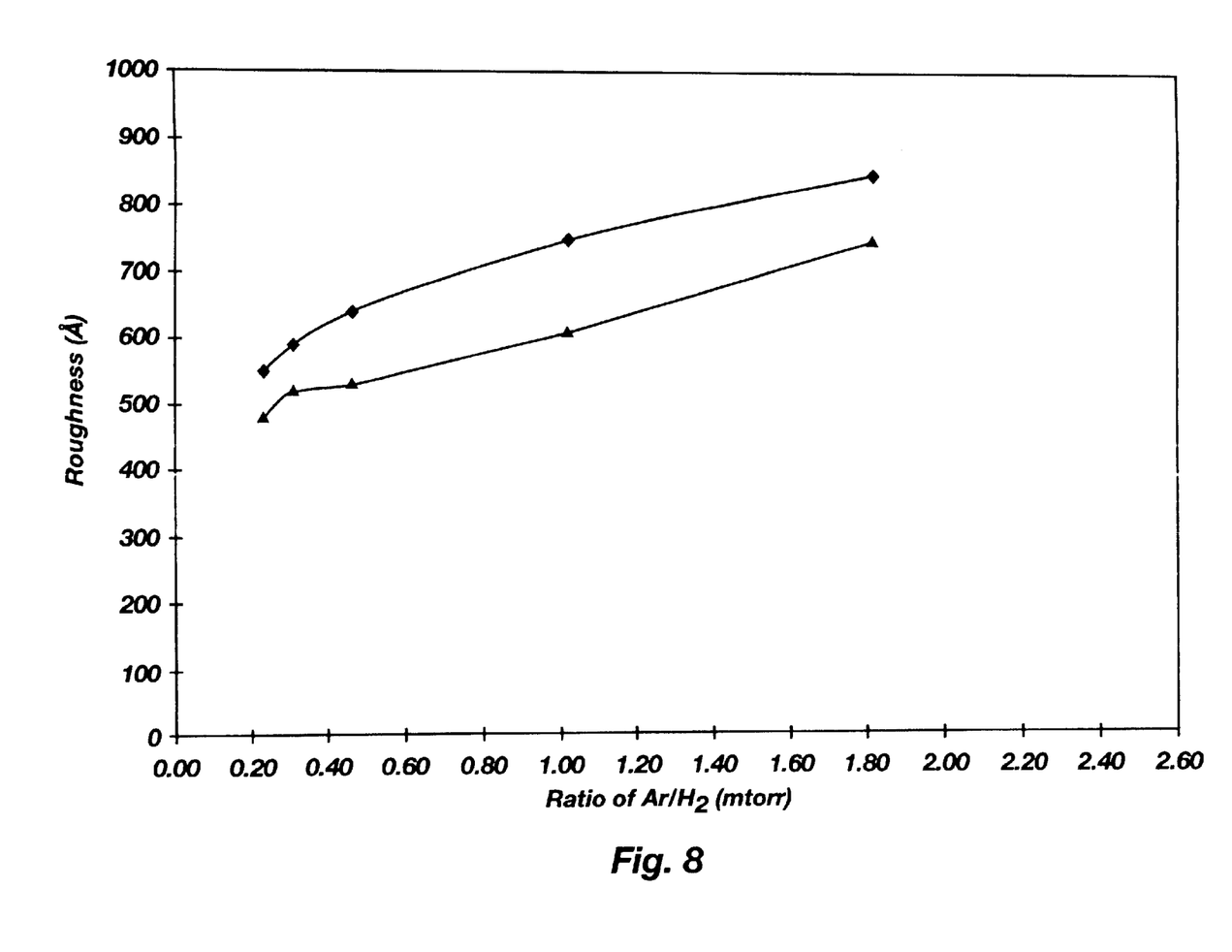
FIG. 8 is a graph of roughness measurements (by atomic force microscopy) of various aluminum-containing films made in accordance with methods of the present invention.

FIG. 8 illustrates the roughness of the aluminum-containing film samples. As FIG. 8 illustrates, the higher the amount of hydrogen gas delivered to the sputter deposition chamber (i.e., the lower the Ar/H$_2$ ratio—x-axis), the smoother the aluminum-containing film (i.e., lower roughness—y-axis).

Figure 9:
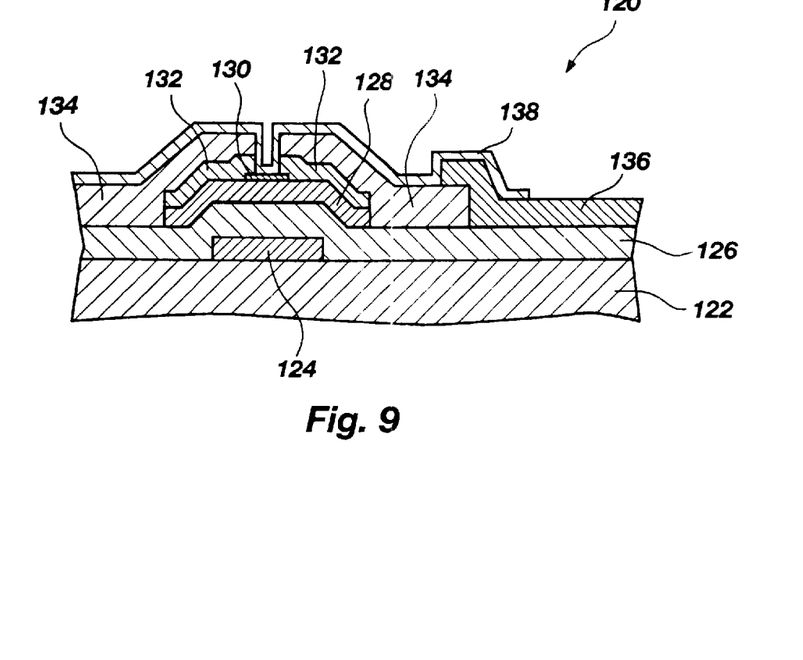
FIG. 9 is a cross-sectional side view illustration of a thin film transistor utilizing a gate electrode and source/drain electrodes formed from an aluminum-containing film produced by a method of the present invention.

FIG. 9 illustrates a thin film transistor 120 utilizing a gate electrode and source/drain electrodes which may be formed from an aluminum-containing film produced by a method of the present invention. The thin film transistor 120 comprises a substrate 122 having an aluminum-containing gate electrode 124 thereon which may be produced by a method of the present invention. The aluminum-containing gate electrode 124 is covered by an insulating layer 126. A channel 128 is formed on the insulating layer 126 over the aluminum-containing gate electrode 124 with an etch stop 130 and contact 132 formed atop the channel 128. An aluminum-containing source/drain electrode 134 which may be produced by a method of the present invention is formed atop the contact 132 and the insulating layer 126, and contacts a picture cell electrode 136. The aluminum-containing source/drain electrode 134 is covered and the picture cell electrode 136 is partially covered by a passivation layer 138.

Figure 10:
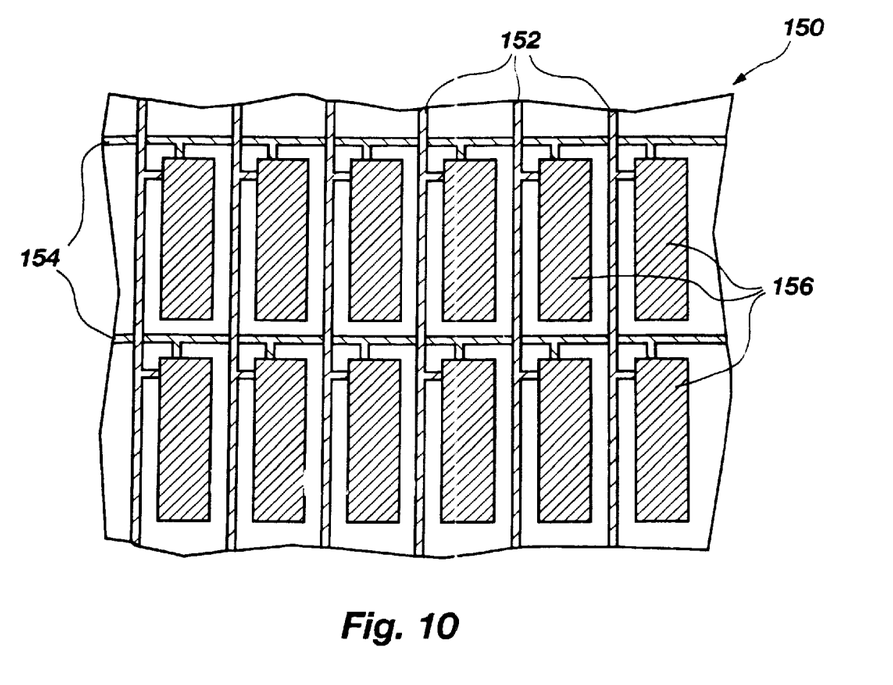
FIG. 10 is a schematic of a standard active matrix liquid crystal display layout utilizing column buses and row buses formed from an aluminum-containing film produced by a method of the present invention.

FIG. 10 is a schematic of a standard active matrix liquid crystal display layout 150, utilizing column buses 152 and row buses 154 formed from an aluminum-containing film produced by a method of the present invention. The column buses 152 and row buses 154 are in electrical communication with pixel areas 156 (known in the art) to form the active matrix liquid crystal display layout 150.

Having thus described in detail preferred embodiments of the present invention, it is to be understood that the invention defined by the appended claims is not to be limited by particular details set forth in the above description, as many apparent variations are possible without departing from the spirit or scope thereof

What is claimed is:

1. A semiconductor device comprising at least one conductive component formed from a substantially hillock-free aluminum-containing film consisting essentially of aluminum having an oxygen content of at least about 12% (atomic).

2. The semiconductor device of claim 1, wherein said oxygen content in said aluminum of said substantially hillock-free aluminum-containing film is in the range of between about 12% and 30% (atomic).

3. The semiconductor device of claim 1, wherein said substantially hillock-free aluminum-containing film is formed by sputter depositing aluminum metal on a substrate in the presence of hydrogen gas and oxygen gas.

4. A thin film transistor comprising:

a substrate;

a substantially hillock-free aluminum-containing gate electrode consisting essentially of aluminum and oxygen formed on said substrate;

an insulating layer covering said substantially hillock-free aluminum-containing gate electrode and substantially coextensive with said substrate;

a channel covering a portion of said insulating layer over said substantially hillock-free aluminum-containing gate electrode;

a contact point atop said channel;

an etch stop substantially covering said channel and a portion of said contact point;

a substantially hillock-free aluminum-containing source/drain electrode consisting essentially of aluminum and oxygen in contact with said contact point and said insulating layer;

a picture cell electrode in contact with said substantially hillock-free aluminum-containing source/drain electrode; and a passivation layer substantially covering said substantially hillock-free aluminum-containing source/drain electrode and partially covering said picture cell electrode.

5. The thin film transistor of claim 4, wherein said substantially hillock-free aluminum-containing gate electrode consisting essentially of aluminum and oxygen includes an oxygen content of at least about 12% (atomic).

6. The thin film transistor of claim 5, wherein said oxygen content in said aluminum of said substantially hillock-free aluminum-containing gate electrode consisting essentially of aluminum and oxygen is in the range of between about 12% and about 30% (atomic).

7. The thin film transistor of claim 5, wherein said substantially hillock-free aluminum-containing gate electrode consisting essentially of aluminum and oxygen formed by sputter depositing aluminum metal on a said substrate in the presence of hydrogen gas and oxygen gas.

8. The thin film transistor of claim 4, wherein said substantially hillock-free aluminum-containing source/drain electrode consisting essentially of aluminum and oxygen includes an oxygen content of at least about 12% (atomic).

9. The thin film transistor of claim 8, wherein said oxygen content in said aluminum of said substantially hillock-free aluminum-containing source/drain electrode consisting essentially of aluminum and oxygen is in the range of between about 12% and about 30% (atomic).

10. The thin film transistor of claim 8, wherein said substantially hillock-free aluminum-containing source/drain electrode consisting essentially of aluminum and oxygen formed by sputter depositing aluminum metal on a said contact point and said insulating layer in the presence of hydrogen gas and oxygen gas.

11. An active matrix liquid crystal display comprising:

a plurality of column buses, said plurality of column buses comprising a substantially hillock-free aluminum-containing column film consisting essentially of aluminum having an oxygen content of at least about 12%(atomic) and a plurality of row buses, said plurality of row buses comprising a substantially hillock-free aluminum-containing row film consisting essentially of aluminum having an oxygen content of at least about 12% (atomic).

12. The active matrix liquid crystal display of claim 11, wherein said oxygen content of said substantially hillock-free aluminum-containing column film is in the range of between about 12% and about 30%(atomic).

13. The active matrix liquid crystal display of claim 12, wherein said substantially hillock-free aluminum-containing column film is sputter deposited from aluminum metal in the presence of hydrogen gas and oxygen gas.

14. The active matrix liquid crystal display of claim 11, wherein said oxygen content of said substantially hillock-free aluminum-containing row film is between about 12% and about 30%(atomic).

15. The active matrix liquid crystal display of claim 14, wherein said substantially hillock-free aluminum-containing row film is sputter deposited from aluminum metal in the 0presence of hydrogen gas and oxygen gas.

\* \* \* \* \*

UNITED STATES PATENT AND TRADEMARK OFFICE
CERTIFICATE OF CORRECTION

PATENT NO.     : 6,455,939 B1
DATED          : September 24, 2002
INVENTOR(S)    : Kanwal K. Raina and David H. Wells It is certified that error appears in the above-identified patent and that said Letters Patent is hereby corrected as shown below:

Title page,
Item [56], References Cited, U.S. PATENT DOCUMENTS, "5,367,179 A" reference, before "11/1994" delete "*"
OTHER PUBLICATIONS, "Lee et al.," reference, change "AIN" to -- AlN --

Column 1,
Line 17, change ",as" to -- gas --

Column 7,
Line 48, change "measure" to -- measured --

Column 8,
Line 33, insert a period after "thereof"

Column 9,
Line 19, insert -- is -- before "formed"
Line 20, before "said" delete "a"
Line 33, insert -- is -- after "oxygen"

Column 10,
Line 1, before "said" delete "a"
Line 9, insert a semicolon after "(atomic)"

Signed and Sealed this

Twenty-seventh Day of January, 2004

JON W. DUDAS
*Acting Director of the United States Patent and Trademark Office*